(12) United States Patent
Fink et al.

(10) Patent No.: US 6,352,791 B1
(45) Date of Patent: Mar. 5, 2002

(54) ELECTRON-CONDUCTING LAYER IN ORGANIC ELECTROLUMINESCENT ARRANGEMENTS

(75) Inventors: Ralph Fink, Bayreuth; Christoph Jonda, Stuttgart; Hans-Werner Schmidt; Mukundan Thelakkat, both of Bayreuth; Rolf Wehrmann, Krefeld; Martin Hueppauff, Stuttgart, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/043,392

(22) PCT Filed: Jun. 20, 1997

(86) PCT No.: PCT/DE97/01269

§ 371 Date: May 29, 1998

§ 102(e) Date: May 29, 1998

(87) PCT Pub. No.: WO98/04007

PCT Pub. Date: Jan. 29, 1998

(30) Foreign Application Priority Data

Jul. 17, 1996 (DE) .......................................... 196 28 719

(51) Int. Cl.$^7$ ................................................ H05B 33/12
(52) U.S. Cl. ........................ 428/690; 428/704; 428/917; 313/504; 313/506
(58) Field of Search ................................. 428/690, 704, 428/917; 313/504, 506

(56) References Cited

U.S. PATENT DOCUMENTS

| | | | | |
|---|---|---|---|---|
| 5,077,142 A | * | 12/1991 | Sakon et al. .................. | 428/690 |
| 5,420,288 A | * | 5/1995 | Ohta et al. .................... | 548/145 |
| 5,487,953 A | * | 1/1996 | Shirota et al. ................ | 428/690 |
| 5,707,779 A | * | 1/1998 | Naito ........................ | 430/270.1 |

FOREIGN PATENT DOCUMENTS

| | | | |
|---|---|---|---|
| JP | 7-157473 | * | 6/1995 |
| WO | WO90/13148 | | 11/1990 |

\* cited by examiner

Primary Examiner—Marie Yamnitzky
(74) Attorney, Agent, or Firm—Kenyon & Kenyon (57) ABSTRACT

An electroluminescent arrangement made up of at least two electrodes and a light-emitting layer system comprising at least one electron-conducting layer, the electron-conducting layer containing at least one compound having a triazine basic member.

16 Claims, 2 Drawing Sheets

ELECTRON-CONDUCTING LAYER IN ORGANIC ELECTROLUMINESCENT ARRANGEMENTS

FIELD OF THE INVENTION

The present invention relates to electroluminescent arrangements, and in particular an electroluminescent arrangement utilizing a light-emitting organic layer system.

BACKGROUND INFORMATION

Electroluminescent systems are characterized in that light is emitted when an electrical voltage is applied and current is flowing. Systems of this kind have been known for some time under the designation LED (light-emitting diode). Light emission is caused by the fact that positive charge carriers (hereinafter referred to as "holes") and negative charge carriers (electrons) recombine with one another, emitting light. LEDs used in the art generally consist of inorganic semiconductor materials. Also known are electroluminescent systems whose essential constituents consist of organic compounds. LEDs made up of organic compounds have one or more thin layers of organic charge transport compounds. WO 90/13148 describes electroluminescent arrangements in which poly(p-phenylenevinylene) is used. The organic compound performs the function of light emission and electron and hole conduction.

SUMMARY OF THE INVENTION

The electroluminescent arrangement according to the present invention has the advantage of making available a new class of compounds for use in electron-conducting layers in LEDs which has not hitherto been used for this purpose. The spectrum of available organic compounds for the production of electroluminescent arrangements is thus considerably expanded. The compounds used according to the present invention, having triazine basic members, are characterized in that they preferentially conduct electrons and block holes. Electroluminescent arrangements with an electron-conducting layer according to the present invention exhibit a considerably higher light intensity than arrangements without said layer.

The present invention concerns, in particular, an electroluminescent arrangement made up of at least two electrodes and a light-emitting layer system comprising at least one electron-conducting layer, the electron-conducting layer containing at least one preferably low-molecular-weight compound having a triazine basic member.

In conjunction with the present invention, a "triazine basic member" is understood to mean a nitrogen-containing heterocyclic compound of empirical formula $C_3H_3N_3$ having three nitrogen atoms in a six-membered ring, in particular 1,2,3-triazine, 1,2,4-triazine, and 1,3,5-triazine. The electroluminescent arrangement of the present invention thus comprises at least two electrodes, i.e. an anode and a cathode, and at least one light-emitting layer system having at least one electron-conducting layer, which depending on its nature and composition can also act in light-emitting fashion.

In a particularly preferred embodiment, the compound has a structure of general formula (I)

(II)

(III)

in which the organic radicals $R_1$, $R_2$, and $R_3$ are selected from the group of compounds shown below:

-continued

-continued and such that the substituents X, Y, and Z are selected from the group consisting of hydrogen; halogen, oxygen, sulfur atoms; cyanoalkyl, alkyl, alkoxy, arylalkyl, sulfoxyl, sulfonyl, and trifluoromethyl groups; and such that the radical $R_4$ is selected from the group of compounds shown below:

-continued

In addition to the coupling points illustrated, for example 1,4-substitution, all other couplings of $R_4$ are of course also possible and are thus within the scope of the present invention.

In a particularly preferred embodiment, the electroluminescent arrangement of the present invention has multiple layers, in particular an anode applied on a substrate, at least one hole-injecting layer applied on the anode, at least one hole-conducting layer applied on the hole-injecting layer, at least one emitter layer applied on the hole-conducting layer, at least one electron-conducting layer applied on the emitter layer, at least one electron-injecting layer applied on the electron-conducting layer, and a cathode applied on the electron-injecting layer, this substrate/layer system preferably being encapsulated. Of course it is also possible for certain of the aforesaid layers not to be present, but rather for certain, or all, functions, including light emission, to be localized in one layer or a few layers. The electron-conducting layer of the present invention can also perform other functions, for example acting in electroluminescent fashion.

One of the electrodes can be transparent or semitransparent. A transparent, electrically conductive anode made of a metal oxide, for example indium-tin oxide (ITO), is preferably used.

The cathode is preferably produced from metals such as Mg, Ag, Al, In, etc., which guarantee good electron injection.

For production of the arrangements according to the present invention, the compounds used according to the present invention, which have a triazine basic member, can, for example, be applied by vacuum evaporation onto the electrodes or optionally onto other layers.

DETAILED DESCRIPTION

The present invention is described with reference to exemplary embodiments and Figures relevant thereto.

Figure 1:
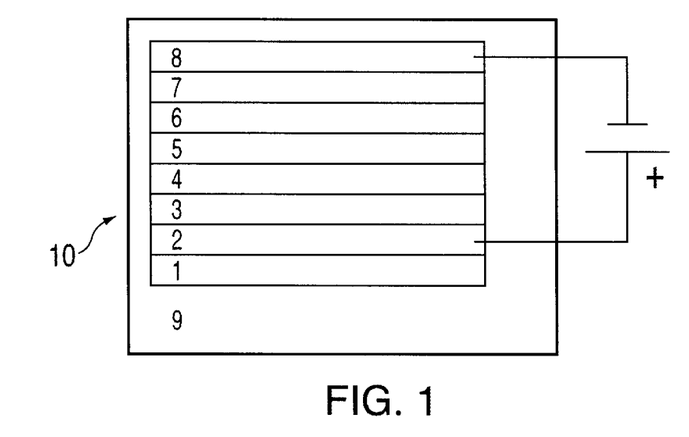
FIG. 1 shows the schematic structure of an electroluminescent arrangement according to the present invention.

FIG. 1 schematically explains the structure of an organic light-emitting diode (O-LED) 10 as defined by the present invention.

Arranged on substrate 1 is an anode 2, over which a hole-injecting layer 3 is applied. The latter is covered by a hole-conducting layer 4 and a light emitter layer 5 arranged thereon. Located on light emitter layer 5 is an electron-conducting layer 6 and an electron-injecting layer 7 arranged above the latter. Electron-conducting layer 6 has a compound with a structure as defined in formula (IV) below, which advantageously preferentially conducts electrons and blocks holes. Arranged above this layer system is a cathode 8. The entire electroluminescent arrangement 10 is encapsulated by casing 9.

Figure 2:
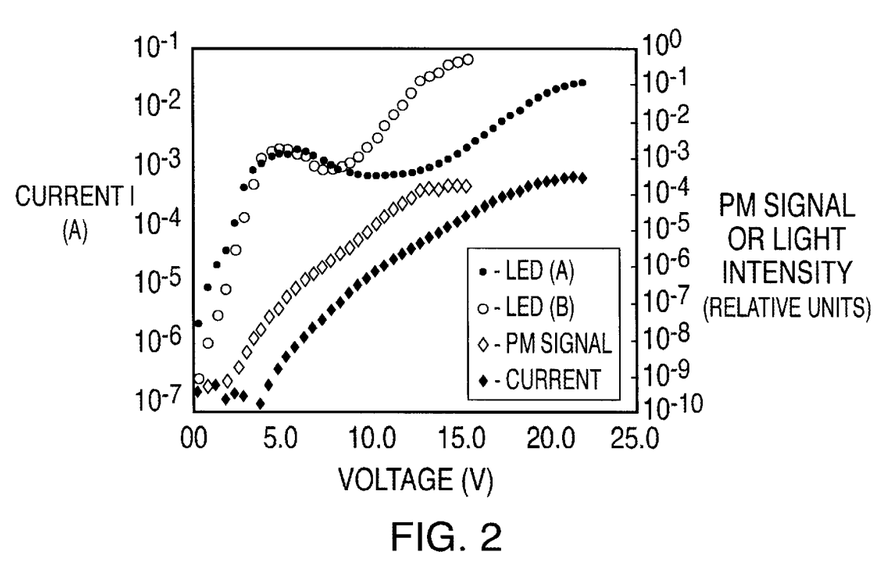
FIG. 2 shows the result of a comparison in light intensity between an arrangement according to the existing art (A) and one according to the present invention (B)
Figure 3:
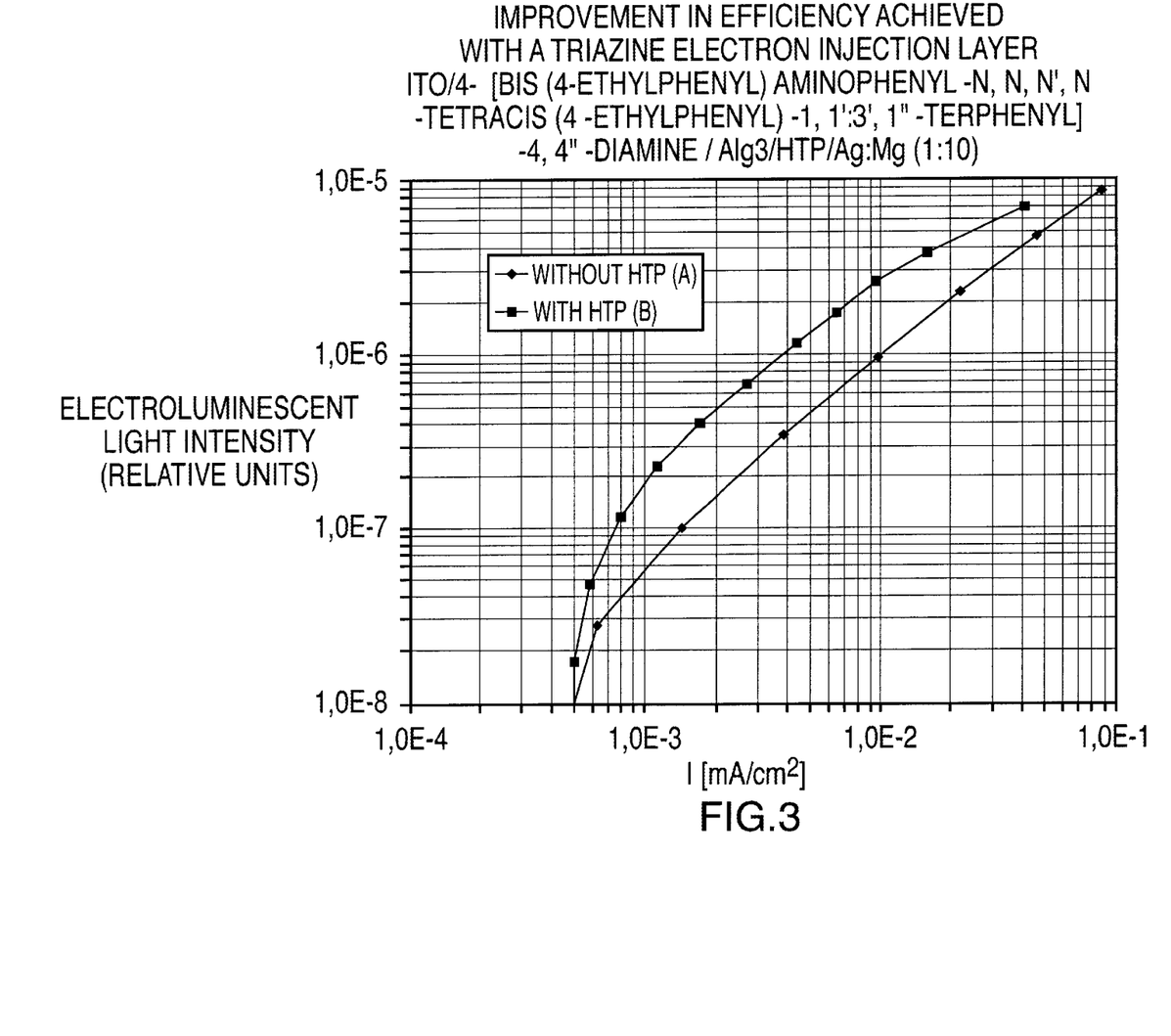
FIG. 3 shows the result of a further comparison in light intensity between an arrangement according to the existing art (A) and one according to the present invention (B).

FIGS. 2 and 3 show the results of light intensity measurements for an arrangement (A) as defined in the existing art, and for an arrangement according to the present invention (B). FIG. 2 shows the result when Example 1 is used, and FIG. 3 the result when Example 2 is used.

Production of the Arrangements

EXAMPLE 1

For the production of LED (A), i.e. the arrangement as defined in the existing art, an 80-nm thick layer of the hole-conducting material 4,4'-dimethoxy-TPD (DTPD) was applied by vacuum evaporation onto a cleaned glass substrate coated with indium-tin oxide (ITO). Onto this layer, a 40-nm thick layer of the emitter Alq$_3$ (aluminum(III) tris(8-hydroxyquinolate)) was applied by vacuum evaporation. An aluminum cathode was evaporated onto the emitter layer.

For production of the composition (arrangement (B)) containing triazine basic members, to be used according to the present invention, the aforesaid arrangement (A) was produced, but before the final application of aluminum to produce the cathode, an electron-conducting layer of HTP [4,4'-(hexafluoroisopropylidene)-bis(4-phenoxyphenyl-4-(4,6-diphenyl-1,3,5-triazine))], of a compound of the following formula (IV)

containing a triazine basic member, was evaporated on at a thickness of 30 nm. The structure of the electroluminescent arrangement as defined in the existing art (A) and by the invention (B) may thus be presented as follows:

(A) Glass substrate/ITO/4,4'-dimethoxy-TPD (80 nm)/ Alq$_3$ (40 nm)/Al cathode (B) Glass substrate/ITO/4,4'-dimethoxy-TPD (80 nm)/ Alq$_3$ (40 nm)/HTP (30 nm)/Al cathode

The Table below and FIG. 2 illustrate the advantages of organic light-emitting diodes (B) with the electron-conducting layer having the triazine basic member according to the present invention, as compared with conventional organic light-emitting diodes (A) in which this layer is absent.

|  | $I_{max}$ (A) | Luminosity (cd/m$^2$) |
|---|---|---|
| (A) ITO/D-TFD/Alq$_3$ | 36 | 250 |
| (B) ITO/D-TFD/Alq$_3$/HTP | 26 | 600 |

The Table and FIG. 2 show clearly that arrangement (B), containing the additional electron-conducting layer according to the invention, is more efficient by a factor of approximately 3 than the system as defined in the existing art (A).

EXAMPLE 2

For production of light-emitting diode (A), i.e. the arrangement as defined in the existing art, a layer of the hole-conducting material 4-[bis(4-ethylphenyl) aminophenyl-N,N,N',N'-tetracis(4-eth ylphenyl)-1,1':3',1''-terphenyl]-4,4''-diamine (EFTP), as defined by the following formula was applied onto a cleaned glass substrate coated with indium-tin oxide (ITO). The hole-conducting material EFTP was spin-coated from a 2% solution (solvent= cyclohexanone) at 1750 rpm. Film thickness was 40 nm.

Onto this layer, a 60-nm thick layer of the emitter Alq$_3$ (aluminum(III) tris(8-hydroxyquinolate) was applied by vacuum evaporation.

A MgAg cathode (10:1 at %) was evaporated onto the emitter layer. The MgAg alloy was evaporated on by codeposition from two thermal evaporator sources.

For production of the compound (arrangement (B)) containing triazine basic elements, to be used according to the invention, the aforesaid arrangement (A) was produced, but before the final application of MgAg to produce the cathode, an electron-conducting layer of HTP, a compound containing triazine basic elements and having the following formula was evaporated on at a thickness of 47 nm. The structure of the electroluminescent arrangement as defined in the existing art (A) and by the invention (B) may thus be presented as follows:

(A) Glass substrate/ITO/EFTP (40 nm)/Alq$_3$ (60 nm)/ MgAg cathode (B) Glass substrate/ITO/EFTP (40 nm)/Alq$_3$ (50 nm)/HTP (47 nm)/MgAg cathode The Table below and FIG. 3 illustrate the advantages of organic light-emitting diodes (B) with the electron-conducting layer having the triazine basic member according to the present invention, as compared with conventional organic light-emitting diodes (A) in which this layer is absent.

|  | I (A/cm$^2$) | Luminosity (cd/m$^2$) |
|---|---|---|
| (A) ITO/EFTP/Alq$_3$/Mg | 0.01 | 280 |
| (B) ITO/EFTP/Alq$_3$/HTP/MgAg | 0.01 | 760 |

The Table and FIG. 3 show clearly that arrangement (B), containing the additional electron-conducting layer according to the invention, is more efficient by a factor of approximately 3 than the system as defined in the existing art (A).

What is claimed is:

1. An electroluminescent arrangement, comprising:

at least two electrodes; and a light-emitting layer system including at least one electron-conducting layer, the at least one electron-conducting layer including at least one compound selected from the group consisting of unsubstituted 1,2,3-triazine, 1,2,4-triazine, and 1,3,5-triazine.

2. An electroluminescent arrangement, comprising:

at least two electrodes; and a light-emitting layer system including at least one emitter layer and at least one electron-conducting layer, wherein the at least one electron-conducting layer does not emit light and includes at least one compound having a structure of general formula:

wherein $R_1$, $R_2$, and $R_3$ are organic radicals selected from the group consisting of:

-continued

-continued wherein X, Y, and Z are substituents selected from the group consisting of: hydrogen; halogen, oxygen, and sulfur atoms; cyanoalkyl, alkyl, alkoxy, arylalkyl, sulfoxyl, sulfonyl, and trifluoromethyl groups.

3. An electroluminescent arrangement, comprising:

at least two electrodes; and a light-emitting layer system including at least one emitter layer and at least one electron-conducting layer, wherein the at least one electron-conducting layer does not emit light and includes at least one compound having a structure of general formula:

(II)

wherein $R_1$ and $R_2$ are organic radicals selected from the group consisting of:

-continued wherein X, Y, and Z are substituents selected from the group consisting of: hydrogen; halogen, oxygen, and sulfur atoms; cyanoalkyl, alkyl, alkoxy, arylalkyl, sulfoxyl, sulfonyl, and trifluoromethyl groups; and wherein $R_4$ is a radical selected from the group consisting of:

wherein X, Y, and Z are substituents selected from the group consisting of: hydrogen; halogen, oxygen, and sulfur atoms; cyanoalkyl, alkyl, alkoxy, arylalkyl, sulfoxyl, sulfonyl, and trifluoromethyl groups.

4. An electroluminescent arrangement, comprising:
at least two electrodes; and
a light-emitting layer system including at least one emitter layer and at least one electron-conducting layer, wherein the at least one electron-conducting layer does not emit light and includes at least one compound having a structure of general formula:

(III)

wherein $R_1$, $R_2$ and $R_3$ are organic radicals selected from the group consisting of:

wherein X, Y, and Z are substituents selected from the group consisting of: hydrogen; halogen, oxygen, and sulfur atoms; cyanoalkyl, alkyl, alkoxy, arylalkyl, sulfoxyl, sulfonyl, and trifluoromethyl groups; and wherein $R_4$ is a radical selected from the group consisting of:

-continued wherein X, Y, and Z are substituents selected from the group consisting of: hydrogen; halogen, oxygen, and sulfur atoms; cyanoalkyl, alkyl, alkoxy, arylalkyl, sulfoxyl, sulfonyl, and trifluoromethyl groups.

5. An electroluminescent arrangement, comprising:

at least two electrodes; and a light-emitting layer system including at least one emitter layer and at least one electron-conducting layer, wherein the at least one electron-conducting layer does not emit light and includes the compound having a structure of the formula:

(IV)

6. The arrangement according to claim 3, wherein the light-emitting layer system includes three layers.

7. The arrangement according to claim 6, wherein the three layers include a hole-conducting layer, an emitter layer, and an electron-conducting layer.

8. The arrangement according to claim 7, wherein the hole-conducting layer includes 4,4'-dimethoxy-TPD of the formula:

(V)

9. The arrangement according to claim 7, wherein the hole-conducting layer includes EFTP of the formula:

(VI)

10. The arrangement according to claim 7, wherein the emitter layer includes a photoluminescent substance.

11. The arrangement according to claim 10, wherein the photoluminescent substance includes a fluorescent dye.

12. The arrangement according to claim 7, wherein the emitter layer includes aluminum(III) tris(8-hydroxyquinolate) of the formula:

(VII)

13. The arrangement according to claim 3, wherein the light-emitting layer system is applied on a substrate.

14. The arrangement according to claim 13, wherein the substrate is a glass substrate.

15. The arrangement according to claim 3, wherein the at least two electrodes include an anode, the anode including indium-tin oxide.

16. The arrangement according to claim 3, wherein the at least two electrodes include a cathode, the cathode including at least one of aluminum, magnesium, silver, and indium.

* * * * *